United States Patent
Yedinak et al.

(10) Patent No.: US 7,118,951 B2
(45) Date of Patent: Oct. 10, 2006

(54) METHOD OF ISOLATING THE CURRENT SENSE ON POWER DEVICES WHILE MAINTAINING A CONTINUOUS STRIPE CELL

(75) Inventors: Joseph A. Yedinak, Mountaintop, PA (US); Dwayne S. Reichl, Pocono Lake, PA (US); Douglas J. Lange, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/130,794

(22) Filed: May 17, 2005

(65) Prior Publication Data

US 2005/0272209 A1   Dec. 8, 2005

Related U.S. Application Data

(62) Division of application No. 10/315,719, filed on Dec. 10, 2002, now Pat. No. 6,906,362.

(60) Provisional application No. 60/350,861, filed on Jan. 22, 2002.

(51) Int. Cl.
*H01L 21/8234* (2006.01)
*H01L 21/336* (2006.01)

(52) U.S. Cl. .................. 438/197; 438/281; 438/333
(58) Field of Classification Search ............... 438/197, 438/281, 333, 587
See application file for complete search history.

(56) References Cited

U.S. PATENT DOCUMENTS 6,140,680 A * 10/2000 Pulvirenti .................. 257/341

\* cited by examiner

*Primary Examiner*—David S. Blum
(74) *Attorney, Agent, or Firm*—Thomas R. FitzGerald, Esq.; Hiscock & Barclay, LLP

(57) ABSTRACT

An integrated circuit die includes an active area having source dopants and contacts. An active area metal layer overlies the active area. A sense area is disposed on the die. A sense area metal layer overlies the sense area. A plurality of polysilicon gate stripes, polysilicon openings, and body stripes are disposed on the die, and extend in a continuous and uninterrupted manner from the active area into the sense area. A first region from which source dopants and contacts have been excluded surrounds a periphery of the sense area. An etched region is disposed over the first region, thereby separating and electrically isolating the sense area metal layer from the active area metal layer.

9 Claims, 6 Drawing Sheets

METHOD OF ISOLATING THE CURRENT SENSE ON POWER DEVICES WHILE MAINTAINING A CONTINUOUS STRIPE CELL

CROSS REFERENCE TO RELATED APPLICATIONS

This application is a divisional of U.S. patent application Ser. No. 10/315,719, filed Dec. 10, 2002, now U.S. Pat. No. 6,906,362 which claims priority to U.S. Provisional Patent Application Ser. No. 60/350,861, filed Jan. 22, 2002.

FIELD OF THE INVENTION

The present invention relates generally to planar or trench stripe power devices, such as, for example, Metal Oxide Field Effect Transistors (MOSFETs) and Integrated Gate Bipolar Transistors (IGBTs), and more particularly to a method and apparatus for isolating the current sense transistor on such devices while maintaining a continuous trench stripe.

DESCRIPTION OF THE RELATED ART

A power MOSFET is typically formed in a geometric pattern of cells. The cells may be in the shape of a closed figure, such as a square or hexagon, or they may comprise a series of parallel longitudinal stripes. The cell is defined at its perimeter by the gate electrode, and the interior of each cell normally contains a source diffusion and a body diffusion. In vertical power MOSFETs a single drain is normally located on the opposite side of the chip from the source and body, and thus underlies the cells.

FIG. 1 illustrates an overhead view of a single cell of a trench-gated MOSFET in a stripe configuration. The outermost region represents one-half of the trenched gate (the other half belonging to the adjacent cell), the middle region represents the source region, and the innermost region represents the body contact region. The body region is in effect a continuation of the body contact region and extends under the source region to the sidewall of the trench, where the channel is located. The hatched regions represent the overlying metal source contact which in many power MOSFETs also contacts the body region to prevent the parasitic bipolar transistor from turning on. An IGBT is a device that has the advantages of both a bipolar transistor and a MOSFET, i.e., it can withstand high voltages, carry large currents, and achieve fast switching speeds. IGBTs are similarly formed in the stripe configuration described above in regard to MOSFETs.

In order to determine the amount of current flowing through a MOSFET or IGBT, a portion of the total device current is isolated and used to predict the total device current. The isolated portion of the total device current flows through a current sensing or detecting device, such as a current sensing transistor, that generates a signal which is indicative of the magnitude of the isolated current and which is used to determine the total device current. Some IGBTs include a current detecting or sensing transistor that is integral and monolithic with the IGBT itself. The current flowing through the main IGBT is divided between the main IGBT and the current detecting/sensing IGBT in proportion to the active areas of each. More particularly, the amount of current flowing through the current detecting/sensing IGBT is determined by the ratio of its active area to the active area of the entire IGBT device. The current flowing through the main IGBT is calculated from this ratio of active areas. Similarly, the amount of current flowing through the current detecting/sensing device in a MOSFET is determined by the ratio of the active area of that current detecting/sensing device to the entire active area of the MOSFET.

Typically, the current from the current detecting/sensing device, i.e., the sensed current, is connected to and flows through a sense resistor that is in series with the MOSFET or IGBT. The flow of the sense current creates a voltage drop across the sense resistor that is proportional to the sense current. The voltage drop across the sense resistor, i.e., the sense voltage, is provided to an analog-to-digital (A/D) converter, or similar device, which converts the sensed voltage to a digital value/signal indicative of the sensed current. This digital equivalent of the sensed current is then read by a microprocessor, which monitors the sensed current and thereby limits the device current and protects the device from an overcurrent condition.

In order to connect the current sensing device to an external circuit, such as the sense resistor described above, the top surface of a current-sensing IGBT and/or MOSFET typically includes a sense pad. In order to accommodate the sense pad and to isolate the current sensing device from the IGBT or MOSFET, the cell structure, most notably the gate and/or base stripes, must be broken along the length of the stripe(s). Such discontinuities in the stripe(s) act as a nucleation site for device failure during operating conditions that stress the device and/or may exceed the forward bias and reverse bias safe operating areas of the device.

Therefore, what is needed in the art is a current-sensing transistor in which the current sensing device is isolated from the main transistor without introducing a discontinuity in the gate and/or base stripes.

Furthermore, what is needed in the art is a method of isolating a current sensing device from the main transistor without introducing a discontinuity in the gate and/or base stripes.

SUMMARY OF THE INVENTION

The present invention provides a current-sensing transistor in which the sense area is isolated form the main die active area while maintaining a continuous and uninterrupted stripe cell geometry.

The invention comprises, in one form thereof, An integrated circuit die includes an active area having source dopants and contacts. An active area metal layer overlies the active area. A sense area is disposed on the die. A sense area metal layer overlies the sense area. A plurality of polysilicon gate stripes, polysilicon openings, and body stripes are disposed on the die, and extend in a continuous and uninterrupted manner from the active area into the sense area. A first region from which source dopants and contacts have been excluded surrounds a periphery of the sense area. An etched region is disposed over the first region, thereby separating and electrically isolating the sense area metal layer from the active area metal layer.

An advantage of the present invention is that no discontinuities are introduced into the stripe cell geometry.

Another advantage of the present invention is that nucleation sites that may contribute to device failure are substantially reduced.

BRIEF DESCRIPTION OF THE DRAWINGS

The above-mentioned and other features and advantages of this invention, and the manner of attaining them, will become apparent and be better understood by reference to the following description of one embodiment of the invention in conjunction with the accompanying drawings, wherein.

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE DRAWINGS

Figure 1:
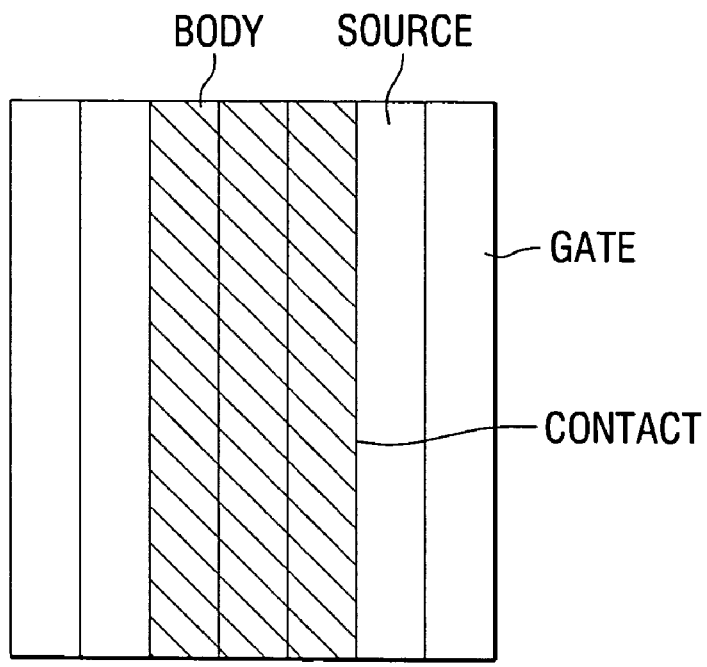
FIG. 1 is a top or overhead view of a MOSFET having a striped cell geometry.
Figure 2:
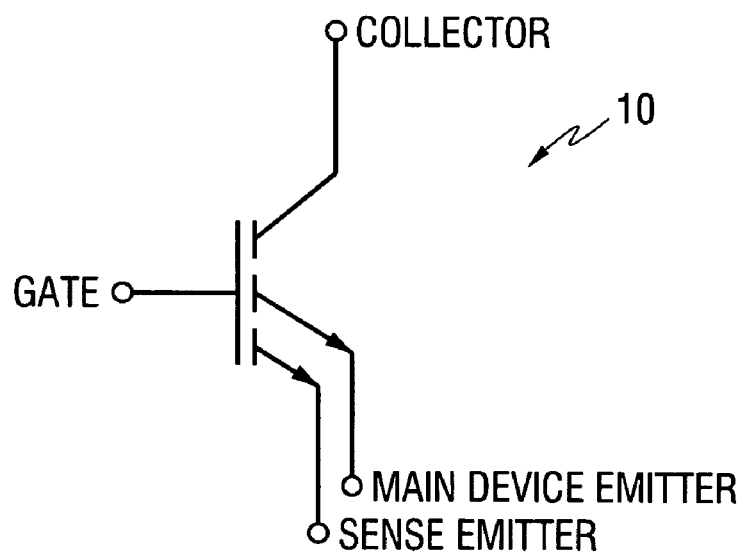
FIG. 2 is a simple schematic of an IGBT having a current detecting or sensing transistor.

Referring now to FIG. 2, a simple schematic of a typical current-sensing IGBT is shown. IGBT 10 includes a gate, collector, main emitter and sense emitter. The current-sensing device or transistor (not referenced) shares a common gate and collector with the main transistor (not referenced), and is thus connected in parallel with the main transistor.

Figure 3:
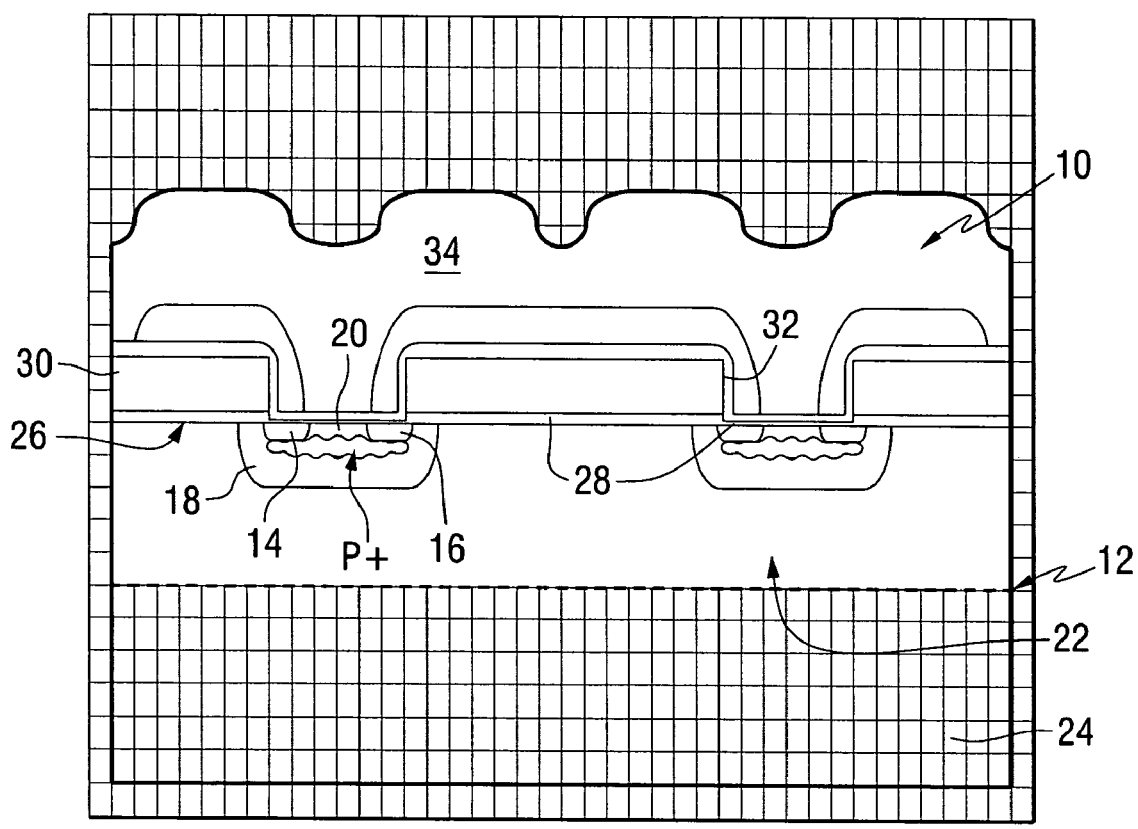
FIG. 3 is a cross-sectional view of a typical stripe cell IGBT.

Referring now to FIG. 3, a cross section of a typical stripe cell IGBT is shown. IGBT 10 has an epitaxial layer 12 that includes two N+ source stripes 14 and 16 that are surrounded by a P-type base stripe 18. The portion of base stripe 18 that lies between source stripes 14 and 16 is designated as body stripe 20. Epitaxial layer 12 includes a lightly-doped N drift region 22 disposed over a heavily doped N buffer region 24. Gate insulating stripes 26 and 28, typically of silicon dioxide, cover the top of epitaxial layer 12. Gate conductive stripes 30 and 32, typically of heavily doped polysilicon (poly), cover insulating stripes 26 and 28, and form a gate electrode (not referenced). Gate conductive stripes 30 and 32 overlie corresponding channel stripes (not referenced) on opposite sides of the base stripe. Another insulating layer (not referenced), typically of silicon dioxide, covers the polysilicon gate stripes 30 and 32. A metal contact stripe 34 contacts the N+ source stripes 14, 16 and the body stripe 20 of each cell.

Figure 4:
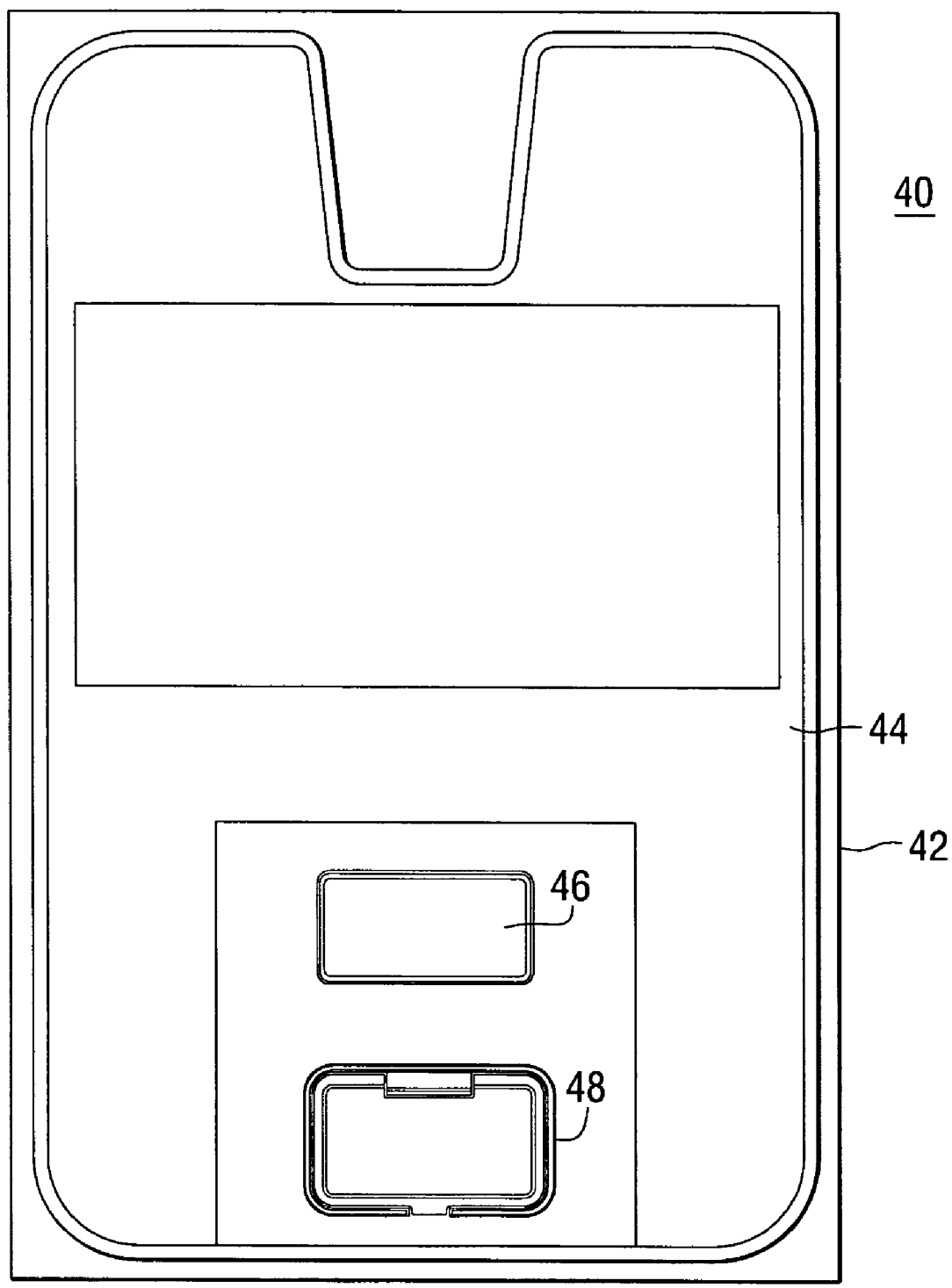
FIG. 4 is a top view of an IGBT of the present invention.
Figure 5:
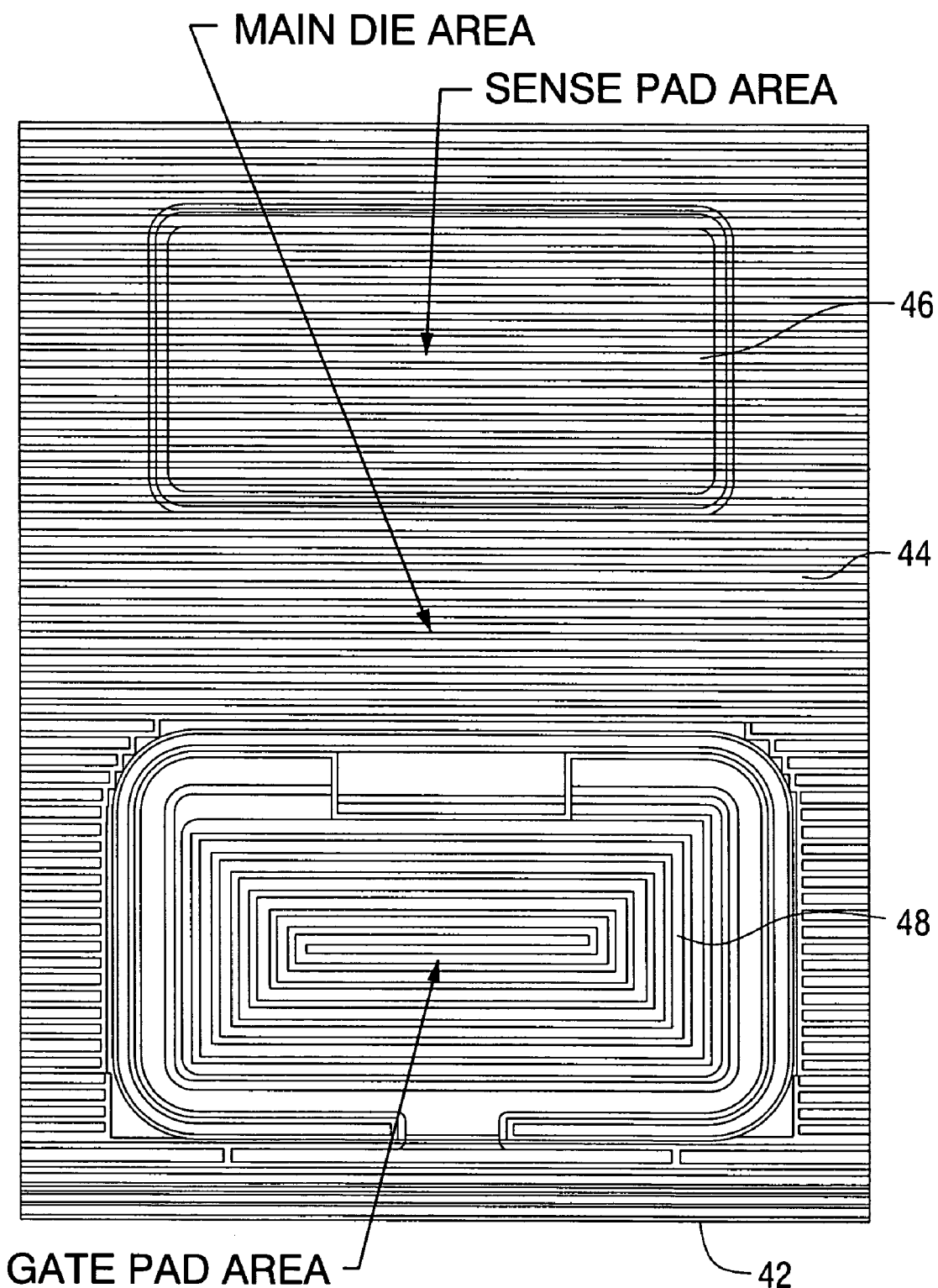
FIG. 5 is a magnification of FIG. 4.

Referring now to FIGS. 4 and 5, a top view of a current-sensing IGBT of the present invention is shown. IGBT 40 is formed on die 42, which includes a main die active area 44, sense pad area 46 and gate pad area 48. The same reference numbers used in describing IGBT 10 have also been used to refer to similar and/or generally corresponding parts and structures of IGBT 40.

Main die active area 44 is the area of die 42 upon which source stripes 30 and 32, base stripes 18 and body stripes 20 of the main transistor (not referenced) of IGBT 40 are formed. Sense pad area 46 is the area of die 42 upon which the sense pad that enables connection to the sense area or transistor is disposed. Similarly, gate pad area 48 is the area of die 42 upon which the gate pad that enables external connection to the gate or gate stripes of IGBT 40 is disposed.

Figure 6:
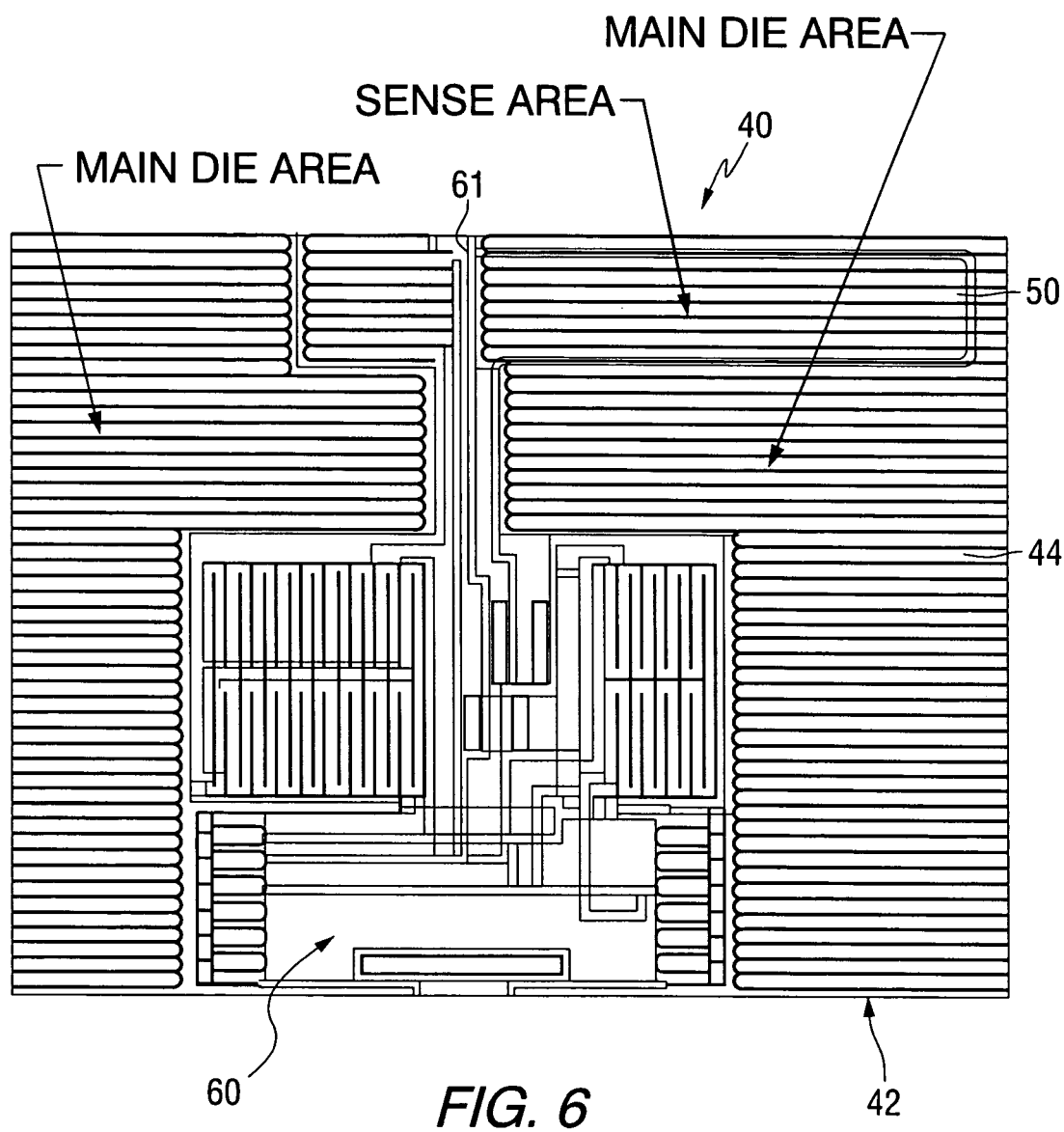
FIG. 6 shows the sense IGBT of FIG. 4 connected to a control circuit that is integral and monolithic with the IGBT die.

As shown in FIG. 6, sense area 50 includes a portion of a plurality of gate stripes 30 and 32, a portion of a plurality of source stripes 14 and 16, a portion of a plurality of base stripes 18, and a portion of a plurality of body stripes 20 that are electrically isolated from the main transistor and dedicated to the sense transistor (not referenced) of IGBT 40, as is more particularly described hereinafter. The poly gate stripes 30 and 32, source stripes 14 and 16, base stripes 18, and body stripes 20 extend in a continuous and uninterrupted manner from main active area 44 into sense area 50. The only discontinuities in the gate stripes 30 and 32, source stripes 14 and 16, base stripes 18, and body stripes 20 that extend from main die area 44 into sense area 50 are where they are broken to enable connection of metal bus 61 between control circuit 60 and sense area 50. Sense area 50 is electrically connected by metal bus 61 to control circuit 60 that is integral and monolithic with die 42.

Control circuit 60 includes, for example, circuitry for over-current and over-temperature protection, a sense resistor, and circuitry for monitoring the sense current and thereby the total device current flowing through IGBT 40. In the embodiment shown, IGBT 40 includes an integral and monolithic control circuit 60. However, it is to be understood that IGBT 40 can be alternately configured, such as, for example, with bond pads of a conductive material, such as a metal, that are deposited over or electrically connected to each of the sense pad and gate pad areas 46 and 48, respectively, and to which bond wires are electrically connected to thereby connect the gate and sense transistor of IGBT 40 to other electrical circuits which are non-monolithic and/or non-integral with die 42.

Figure 7:
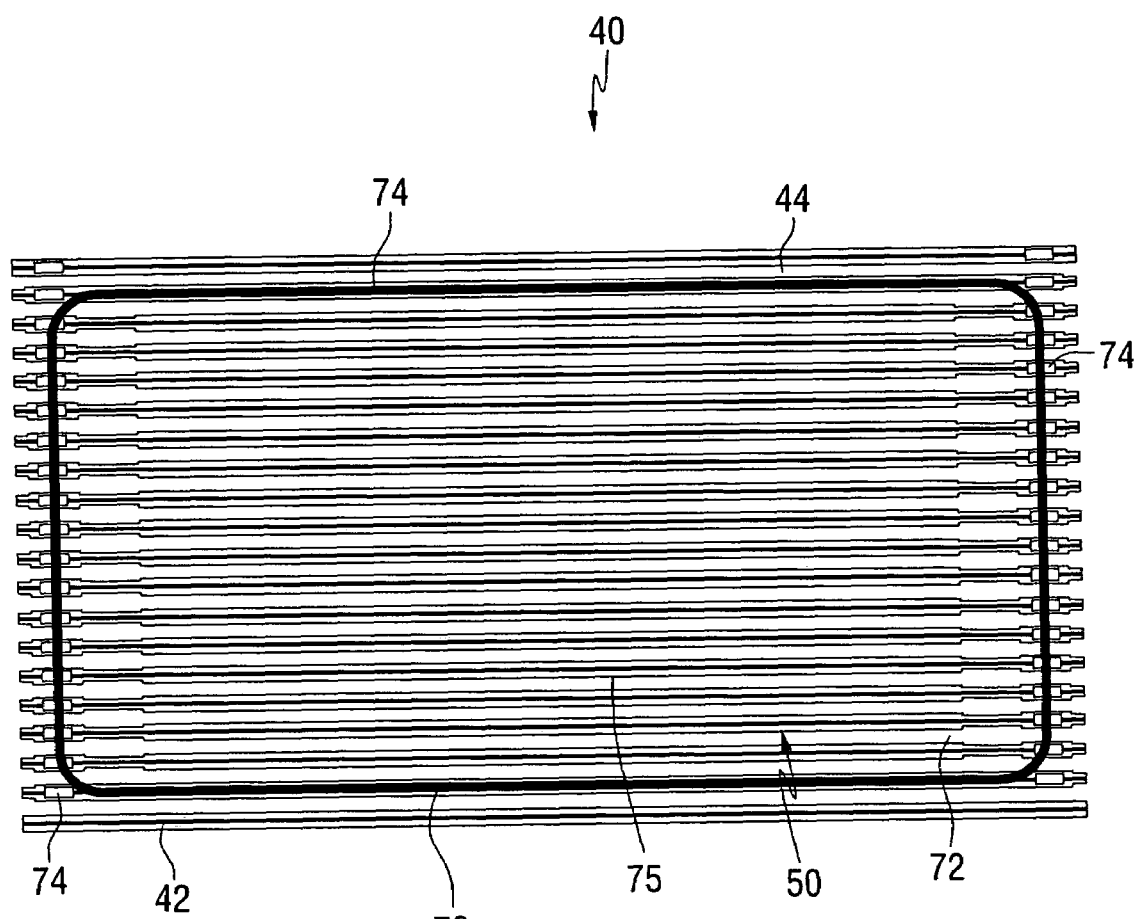
FIG. 7 is a top view of the overlay of polysilicon, N+ source exclude, contact open and metal remove mask layers used to form the IGBT of FIG. 4.

Referring now to FIG. 7, IGBT 40 and the method by which IGBT 40 is formed are described. FIG. 7 shows a detail, top view of die 42, including main die active area 44 and sense area 50. Sense area 50 includes source region 72 and source exclude region 75. Source region 72 has been doped with N+ source dopants, i.e., source region 72 was not been masked off to prevent or preclude the deposition of N+ source dopants. Sense area 50 also includes source exclude region 75 from which the N+ source dopants have been excluded, or masked off. The ratio of source region 72 to source exclude region 75 determines how much of sense area 50 is active, and thereby determines the ratio of the active areas of sense area 50 relative to active area 44. Thus, the total amount of current flowing through IGBT 40 can be calculated by sensing the amount of current flowing through sense area 50.

Both the contact and N+ source dopants are excluded from region 74, which surrounds the periphery of sense area 50 and extends a predetermined distance into main die active area 44. Region 74, i.e., the source and contact exclude region, may or may not overlap sense area 50. The device active area metal overlying region 74 is broken at etched region 76. A gap is thereby formed by etched region 76 around sense area 50 that electrically isolates source regions in source region 72 from source regions in active area 44 and/or from source regions outside sense area 50 of IGBT 40. This electrical isolation permits gate stripes 30 and 32, poly openings, and body stripes 20 to extend in a continuous and uninterrupted manner from main active area 44 into and through sense area 50. Thus, the creation of discontinuities in the stripes is avoided, a continuous and uninterrupted stripe cell geometry is maintained, and the creation nucleation sites is substantially reduced.

As described above, the area of source region 72 of sense area 50 relative to the total active area of IGBT 40 determines the amount of current drawn by sense area 50. Thus, the total current flowing through sense area 50 is determined by measuring the current flowing through sense area 50, and multiplying that current by the inverse of the ratio of the area of source region 72 relative to the total active area of IGBT 40 (i.e., the sum of the areas of source region 72 and active area 44).

Source exclude region 75 of sense area 50 and source and contact exclude region 74 are fabricated by, for example, a mask process wherein a photoresist mask is used to prevent the etching of the oxide or the implanting of the source dopants in regions 74 and 75. The photo-resist is patterned over active area 44, and thus the oxide and implanting of active area 44 is not affected. In order to isolate the metal layer overlying sense area 50 from the metal layer overlying active area 44, the photoresist is open in a region corresponding to region 76, thereby allowing the metal to be etched away from region 76.

In the embodiment shown, the current-sensing transistor of the present is configured as an IGBT. However, it is to be understood that the current-sensing transistor of the present invention can be alternately configured, such as, for example, as a MOSFET.

In the embodiment shown, The only discontinuities in the gate stripes 30 and 32, source stripes 14 and 16, base stripes 18, and body stripes 20 that extend from main die area 44 into sense area 50 are where they are broken to enable connection of metal bus 61 between control circuit 60 and sense area 50. However, it is to be understood that those discontinuities can also be eliminated by similarly isolating the bus according to the method of the present invention.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed:

1. On an integrated circuit die, a method of isolating a current sense area from a main device active area while maintaining a continuous stripe cell, the sense area having an overlying sense metal layer, the main device active area having an overlying active metal layer, said method comprising:
    fabricating on the die a plurality of polysilicon gate stripes, polysilicon openings, and body stripes that extend in a continuous and uninterrupted manner from the active area into the sense area;
    excluding source dopants and contact from a first region that surrounds the periphery of the sense area; and
    breaking the active area metal layer over the first region to thereby electrically isolate the sense area from the active area.

2. The method of claim 1, wherein said first region extends at least partially into each of said sense area and said main device area.

3. The method of claim 1, comprising the further step of excluding source dopants from a source exclude region of the sense area.

4. The method of claim 3 comprising the further step of doping a source region of the sense area with source dopants.

5. The method of claim 4, wherein said source region surrounds said source exclude region.

6. The method of claim 1, wherein said breaking step comprises etching the active area metal layer over the first region.

7. The method of claim 1, comprising the further step of electrically connecting said sense area to a control circuit integral and monolithic with the die.

8. The method of claim 1, wherein the integrated circuit is one of an integrated gate bipolar transistor and a metal oxide field effect transistor.

9. The method of claim 8, wherein the transistor is a trench stripe device.

* * * * *